United States Patent [19]

Paquin

[11] Patent Number: 5,791,753
[45] Date of Patent: Aug. 11, 1998

[54] COMPUTER COMPONENT HANDLE ASSEMBLY

[75] Inventor: David M. Paquin, Cypress, Tex.

[73] Assignee: Compaq Computer Corp., Houston, Tex.

[21] Appl. No.: 705,402

[22] Filed: Aug. 29, 1996

[51] Int. Cl.⁶ .................................................. A47B 95/02
[52] U.S. Cl. ................................. 312/332.1; 312/223.1
[58] Field of Search .................................. 361/685, 725, 361/726, 727, 732, 754, 747, 801, 759, 740; 312/223.2, 223.1, 348.6, 332.1; 439/157, 159, 160

[56] References Cited

U.S. PATENT DOCUMENTS

| | | |
|---|---|---|
| 2,514,246 | 7/1950 | Knox .................................. 361/727 |
| 2,609,268 | 9/1952 | Nye .................................. 361/727 X |
| 2,897,033 | 7/1959 | Ford .................................. 312/332.1 |
| 3,563,628 | 2/1971 | Poe .................................. 312/332.1 |
| 3,575,482 | 4/1971 | Mac Master .................................. 361/726 X |
| 3,619,019 | 11/1971 | Hepker .................................. 312/332.1 |
| 4,954,928 | 9/1990 | Jullien .................................. 361/726 X |
| 5,340,340 | 8/1994 | Hastings et al. .................................. 361/727 X |
| 5,586,003 | 12/1996 | Schmitt et al. .................................. 361/727 X |

FOREIGN PATENT DOCUMENTS 2015828  9/1979  United Kingdom .................. 361/726

Primary Examiner—Peter M. Cuomo
Assistant Examiner—Janet M. Wilkens
Attorney, Agent, or Firm—Jenkens & Gilchrist

[57] ABSTRACT

An assembly for facilitating the installation, securement and removal of a computer component from a computer chassis. The assembly includes a base connectable to the computer chassis and a handle pivotally connected to the base. The handle includes a notch and tab portion at each end for engaging a portion of the computer chassis for facilitating the installation of the component with the computer chassis when the handle is pivoted in a first direction and for facilitating the removal of the component from within the computer chassis when the handle is pivoted in a second direction. The handle further includes an aperture for receiving a flexible interlock tab connected to the base for releasable interlocking the handle and the base together, such that this, along with the tab portions of the handle, facilitate securing the computer component within the computer chassis.

17 Claims, 4 Drawing Sheets in the figures. Shown in FIG. 1 is a perspective view of one embodiment of the handle assembly of the present invention secured to a computer component and oriented in an open configuration.

COMPUTER COMPONENT HANDLE ASSEMBLY

FIELD OF THE INVENTION

The present invention relates to an installation handle assembly for securing and removing computer components and, more particularly but not by way of limitation, to a handle and base assembly attachable to a removable computer component for facilitating the installation, securement, and removal thereof relative to a computer chassis or support frame.

BACKGROUND OF THE INVENTION

Early designs of computers generally included a plurality of individual components and assemblies which were connected to one another by means of wires, nuts and bolts. A major advance occurred with the advent of printed circuit boards and modular component assemblies. The printed circuit boards were electrically interconnected with one another and with the individual components by rows of electrically conductive plated fingers inserted into a card edge connector. Similar connectors were then used for coupling the discrete components to each other and to other circuitry in the computer.

The use of modular components and connectors in the design of electronic equipment, such as digital computers, has permitted components and printed circuit boards to be added and removed at will. The addition and deletion of such components and printed circuit boards has facilitated repair, upgrade, and/or changes in functionality in the equipment. Originally, a rule of practice in the maintenance of electrical circuitry, such as computer hardware, was that of always turning the power to the computer off before components or printed circuit boards were added or removed from the computer chassis or support frame. Recent innovations have addressed the desirability to insert and remove modular components and printed cards from electrical equipment, such as computer hardware, when the computer is electrically connected and operational, i.e. "hot." In these cases, it is now possible to disconnect the power from only the connector of the modular component or printed circuit board to be inserted and removed while allowing the adjacent components to remain "hot."

Removable computer components today include disc drives and power supplies. As referenced above, the removability of computer components allows for better overall serviceability of the computer system which is a distinct advantage. A defective power supply in the main or central computer generally requires prompt replacement in order to limit downtime. Modular components and connectors facilitate prompt replacement and are thus popular in many computer designs.

Many current design approaches for computer components utilize metal brackets secured with screws to the computer chassis or support housing to secure and maintain the component therein. This design presents many problems, as the screws are often difficult to handle and require extra time for alignment during the installation of the component within the component connector and the housing. Similarly, extra time is needed to remove and store all of the screws prior to the removal of the component from the connector and the housing. Tools are typically needed to be able to install and remove the brackets from the component and the housing, and the component must be moved relative to the connector in order to install or remove it.

It would be an advantage therefore to provide an installation handle assembly for computer components that would simplify installation and handling, and eliminate the need for removable mounting screws. The present invention provides such an assembly by providing a handle and base assembly attachable to a removable computer component for facilitating the installation, securement and removal thereof relative to a computer chassis or support frame. The handle assembly of the present invention further serves as an ejector handle to facilitate removal of the component from the component connector and housing.

SUMMARY OF THE INVENTION

The present invention overcomes the above identified problems as well as other shortcomings and deficiencies of existing technologies by providing an assembly for quick and secure installation and removal of a computer component from a computer chassis without any tools.

In particular, the present invention provides an assembly for installing, securing and removing a computer component from a computer housing and/or chassis. The assembly includes a base connectable to the modular computer component and a handle pivotally connected to the base. The handle includes two pivot pins, one connected at each end of the handle. The pins are each insertable into corresponding apertures located on extensions at each end of the base. The handle further includes a tab and a notch at each end for engaging a portion of the computer chassis for facilitating the installation of the component with the computer chassis when the handle is pivoted in a first direction and for facilitating the removal of the component from within the computer chassis when the handle is pivoted in a second direction. The assembly further includes an aperture for receiving a flexible interlock tab connected to the base for releasably interlocking the handle and the base together, such that this, along with the tab portions of the handle, facilitate securing the computer component within the computer chassis.

BRIEF DESCRIPTION OF THE DRAWINGS

A more complete understanding of the apparatus of the present invention may be had by reference to the following Detailed Description and appended claims when taken in conjunction with the accompanying drawings wherein:

DETAILED DESCRIPTION

Figure 1:
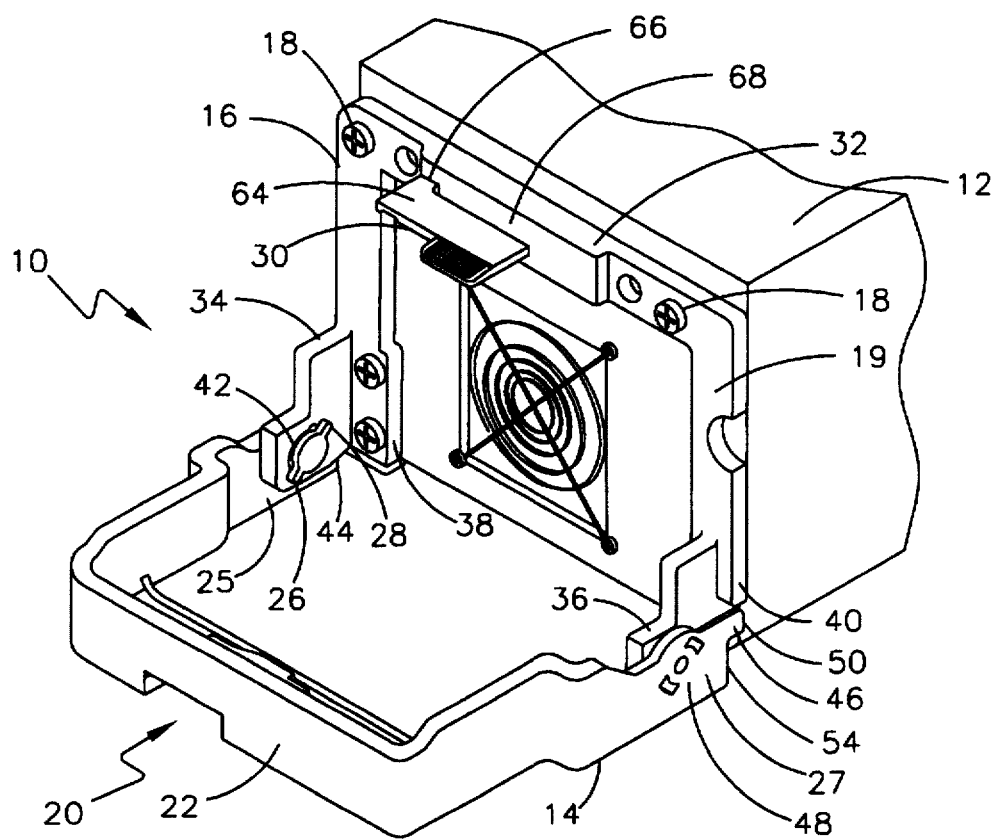
FIG. 1 is a perspective view of one embodiment of the handle assembly of the present invention secured to a computer component and oriented in an open configuration.

Referring now to the drawings wherein like or similar elements are designated with identical reference numerals throughout the several views, and wherein the various elements depicted are not necessarily drawn to scale, and in particular, to FIG. 1, there is shown a preferred embodiment of the present invention in the form of a handle assembly 10 connected to a computer component in the form of power supply 12. Assembly 10 includes a generally 'C'-shaped handle 14 pivotally connected to a generally 'C'-shaped base 16. As depicted in this illustration, the base 16 is secured to a rear face of the power supply 12 with a plurality of screws 18 which extend through the body 19 of base 16.

Handle 14 is constructed with an aperture 20 extending through an upper gripping portion 22 thereof Handle 14 is also constructed with pivot pins disposed on opposite ends 25 and 27, thereof, such as pivot pin 24. Each of the pivot pins is formed with locking ears 26 and 28 to secure the assembly thereof.

Figure 2:
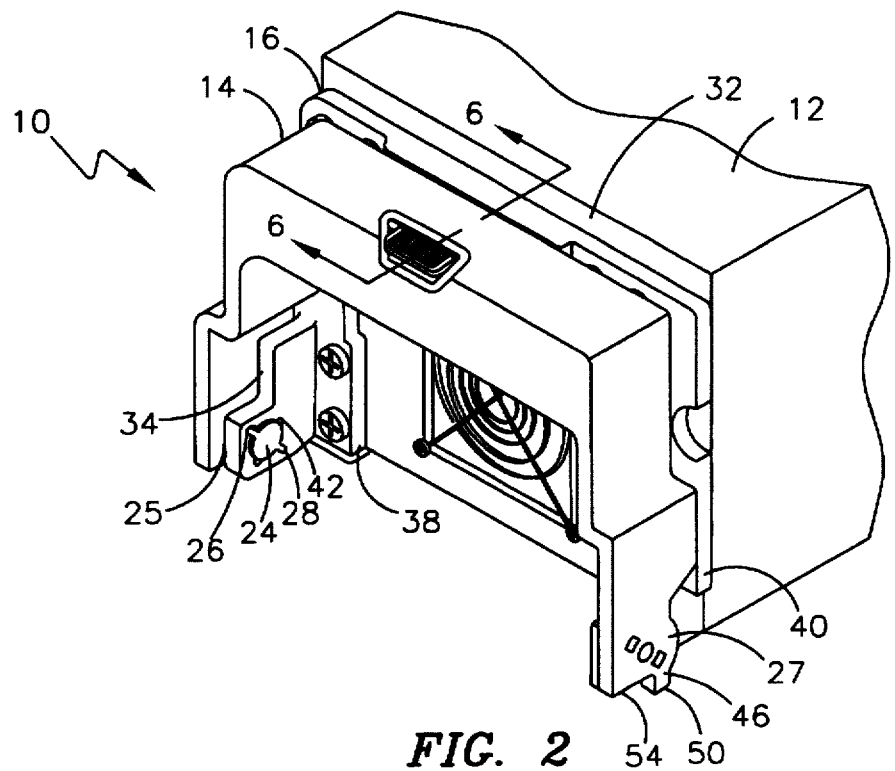
FIG. 2 is a perspective view of the handle assembly of FIG. 1 in a closed and latched configuration relative to the computer component.

Referring still to FIG. 1, base 16 includes an interlock tab 30 extending from the upper body portion 32 thereof The tab 30 is positioned for alignment with aperture 20 when handle 14 is rotated into engagement with base 16 as seen in FIG. 2. Base 16 also includes mounting flanges 34 and 36 extending from ends 38 and 40, respectively, of base 16. The flanges 34 and 36 are disposed adjacent ends 25 and 27 20 of handle 14 and in face to face relationship therewith. The flanges 34 and 36 are also formed with holes 42 extending therethrough, said holes being configured to receive the corresponding pivot pin 24 extending from the respective flange 34 or 36.

Figure 3:
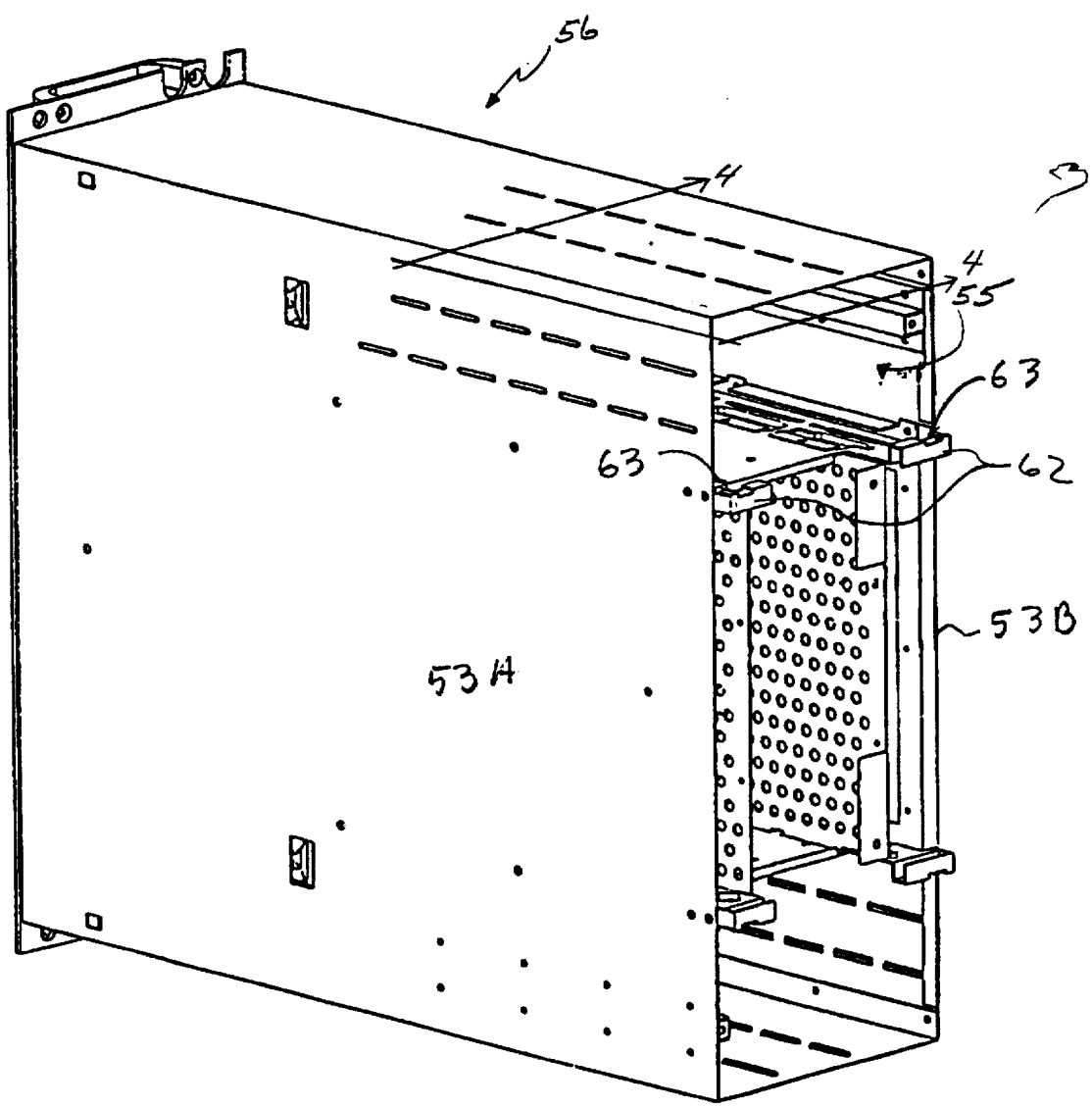
FIG. 3 is a perspective view of a computer chassis into which a computer component utilizing the present invention may be installed.
Figure 4:
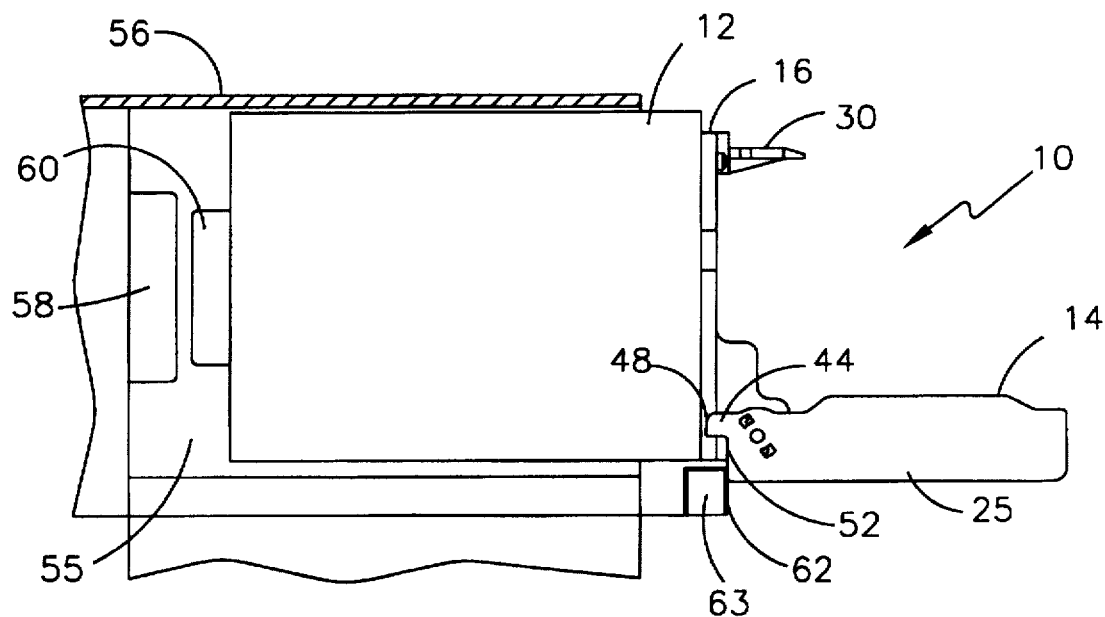
FIG. 4 is an enlarged, side elevational cross sectional, fragmentary view of the handle assembly of FIG. 1 illustrating the installation of the component into a cross section of the computer chassis of FIG. 3, taken along lines 4—4 thereof.

Referring now to FIGS. 1 and 4 in combination, ends 25 and 27 of handle 14 are each formed with tabs 44 and 46. The tabs 44 and 46 form ends 48 and 50 respectively. The tabs 44 and 46 also define notches 52 and 54. Tabs 44 and 46 and notches 52 and 54 have multiple functions and are used to engage a portion of the computer chassis 56 (see FIG. 3) during the installation and securement of power supply 12 therein. The tabs 44 and 46 and notches 52 and 54 further serve to eject the power supply 12 from chassis 56 during its removal therefrom as described in more detail below. Although assembly 10 is illustrated to be connected to a power supply, it is contemplated to be within the scope of the present invention that assembly 10 could also be utilized with other computer and electronic components.

Referring now to FIG. 2, the handle 14 of handle assembly 10 of FIG. 1 has been rotated 90° and is illustrated in the closed or latched position relative to base 16 with power supply 12 secured thereto. As can be seen, hole 42 in mounting flange 34 is configured to accept pin 24 while permitting locking ears 26 and 28 to removably and pivotally secure handle 14 to base 16. This closed configuration of the handle assembly 10 will be discussed in more detail below.

Referring now to FIG. 3, there is illustrated an example of a computer chassis 56 with which the present invention may be utilized. The computer chassis 56 comprises a box shaped structure having thin side walls 53A and 53B defining a compartment 55 therebetween for receiving the power supply 12 therein. Securement fixtures 62 are provided and partially extend from sidewalls 53A and 53B of computer chassis 56. The securement fixtures 62 are formed for mating engagement with tabs 44 and 46 and notches 50 and 52 of handle 14 for effectuating the installation, securement and removal of the power supply 12 within the compartment 55 of computer chassis 56. Each fixture 62 is hollow in construction and formed with a slot 63 providing means for receipt of tabs 44 or 46 as described in more detail with regard to FIGS. 4 and 5 below.

Referring now to FIG. 4, there is shown a fragmentary, side elevational, cross-sectional view of the compartment 55 of computer chassis 56 with the power supply 12 being installed therein. The assembly 10 is connected to the power supply 12 and positioned for the installation of said power supply into the computer chassis 56. The computer chassis 56 is constructed with a plug-in connector 58 for receiving mating connector 60 of power supply 12. As described above, computer chassis 56 includes securement fixtures 62 disposed outside compartment 55 and positioned in alignment with notches 52 and 54 and tabs 44 and 46 of handle 14 when power supply 12 is inserted into opening 55. In this view the handle 14 lies perpendicular to base 16 and the tab 44 is in position for receipt in slot 63 in response to rotation of said handle.

Figure 5:
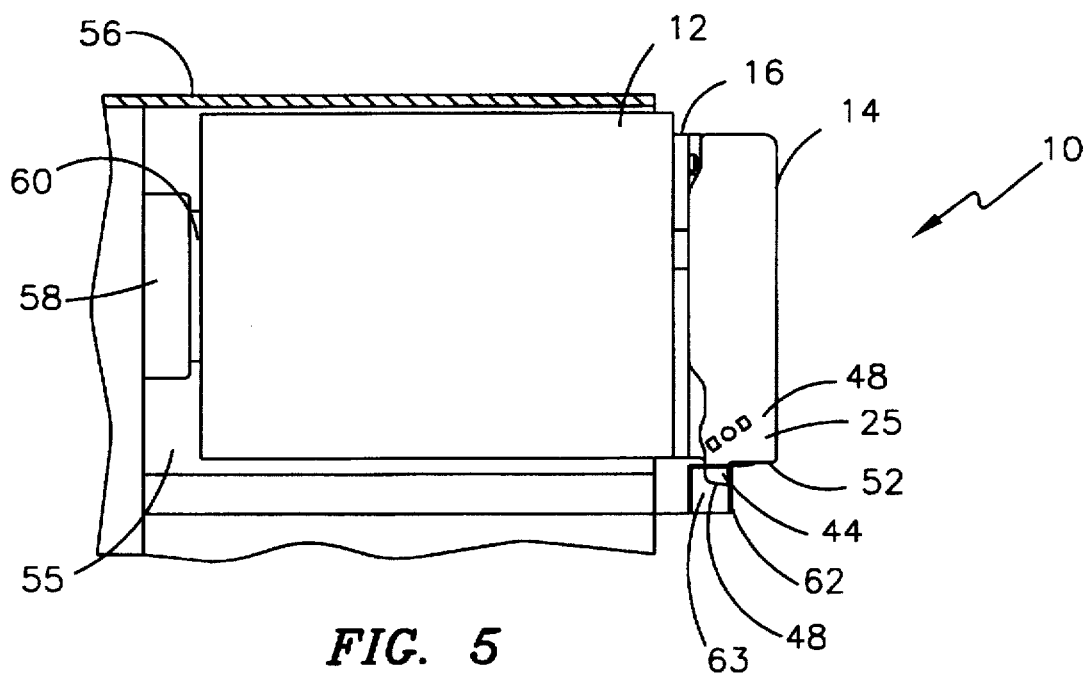
FIG. 5 is the same view as FIG. 4 illustrating the locking and securing of the component with the computer chassis.

Referring now to FIG. 5, there is illustrated the assembly 10, connected to power supply 12 which is fully inserted into computer chassis 56, with connectors 58 and 60 fully seated. As depicted, tab 44 has been rotated into the slot 63 of fixture 62, thereby securing power supply 12 within compartment 55 of computer chassis 56. End 48 thus extends downwardly as handle 14 extends upwardly.

Figure 6:
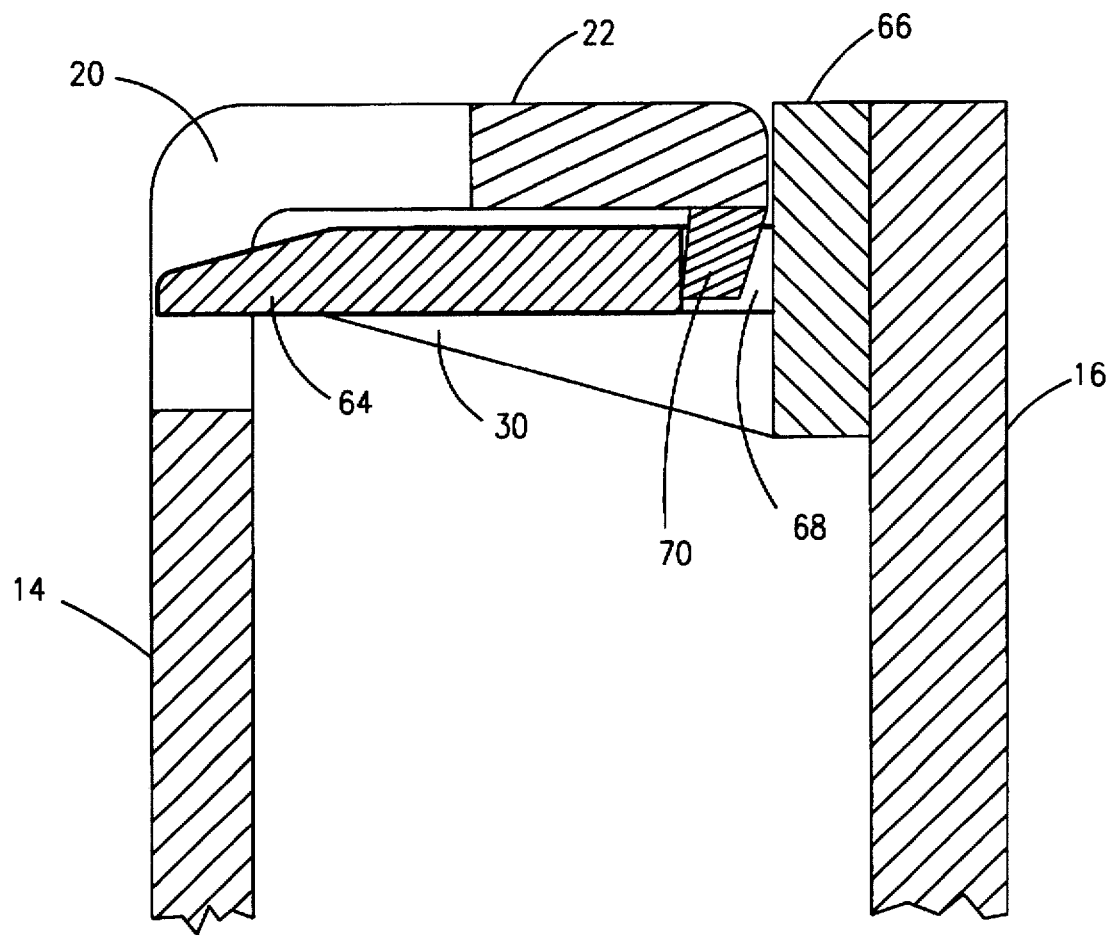
FIG. 6 is a side elevational, cross-sectional view of the handle assembly of FIG. 2 taken along lines 6—6 thereof and illustrating the latching assembly of the present invention.

Referring now to FIG. 6, there is illustrated an enlarged partial cross-sectional view of interlock tab 30 of base 16 interlocking with gripping portion 22 of handle 14. In particular interlock tab 30 includes a flexible body portion 64 connected to base 16 by shoulder 66. A notch 68 is formed in tab 30 and separates the flexible body portion 64 from shoulder 66 for receiving the securing tab 70 therein. Securing tab 70 is formed in and extends from handle 14 adjacent slot 20. In this position, the securing tab 70 has passed over and depressed flexible body portion 64 until securing tab 70 has reached notch 68. Flexible body portion 64 then returns itself to its unflexed position therein locking securing tab 70 within notch 68. For removal, flexible body portion 64 is depressed by a person seeking to remove the power supply 12. The depression of flexible body portion 64 releases securing tab 70 from notch 68, whereupon gripping portion 22 of handle 14 may be rotated away from base 16.

Although good results have been achieved using the above described interlock for handle 14 and base 16, it is contemplated to be within the scope of this invention that other type of interlocks could be used, as well as multiple interlocks per assembly.

Referring now to FIGS. 1–5, the overall operation of the present invention will now be described. In particular, the assembly 10 is first attached to a computer component such as power supply 12 using screws 18. (It is contemplated that other fasteners could be utilized to secure assembly 10 to components 12). For the installation of power supply 12 into computer chassis 56, assembly 10 is opened or unlatched (see FIGS. 1 and 4), wherein the power supply 12 can then be inserted into compartment 55 of computer chassis 56. Power supply 12 is inserted until notches 52 and 54 come into contact with slots 63 of securement fixtures 62 of computer chassis 56 (see FIG. 3).

When notches 52 and 54 contact securement fixtures 62, handle 14 is rotated towards base 16. This rotation causes tabs 44 and 46 to engage slots 63 of securement fixtures 62, forcing power supply 12 deeper into computer chassis 56. Handle 14 is rotated until interlock tab 30 is inserted into aperture 20 and securing tab 70 is interlocked within notch 68. This step not only seats connector 60 within connector 58, but also prevents handle 14 from being prematurely opened, preventing power supply 12 from being inadvertently removed from computer chassis 56. When assembly 10 is in the closed or interlocked position (see FIGS. 2 & 5), tabs 44 and 46 substantially engage securement fixtures 62. This engagement further facilitates the securing of power supply 12 within computer chassis 56.

For the removal of power supply 12 from computer chassis 56 (see generally FIGS. 4 & 5), the flexible body portion 64 of interlock tab 30 is depressed releasing securing tab 70 from notch 68, which permits the rotation of gripping portion 22 of handle 14 away from base 16. When gripping portion 22 of handle 14 is rotated away from base 16, notches 52 and 54 engage the outside of securement fixtures 62 of computer chassis 56. The engagement of notches 52 and 54 with said outside of securement fixtures 62 pushes or ejects power supply 12 from within computer chassis 56 and unseats connector 60 from connector 58, thereby facilitating the removal of power supply 12 from computer chassis 56. Moreover, when power supply 12 is removed and assembly 10 is in the open position (see FIG. 1), the handle 14 can further be used to carry and more readily transport power supply 12.

The present invention described herein above, clearly provides an installation handle assembly for computer components for facilitating the installation, securement and removal of the computer component relative to a computer chassis or support frame.

Although a preferred embodiment of present inventions has been illustrated in the accompanying drawings and described in the foregoing Detailed Description, it will be understood that the invention is not limited to the embodiment disclosed, but is capable of numerous rearrangements, modifications, and substitutions without departing from the spirit of the invention as set forth and defined by the following claims.

What is claimed is:

1. An apparatus for installing, securing and removing a component from a computer housing, said apparatus comprising:

a base connectable to the component;

a generally C-shaped handle including a first end and a second end, with each of said first end and said second end of said handle pivotally connected to said base;

means associated with said handle for installing and removing said component within the computer housing, said means being responsive to the pivoting of said handle in a first direction for effectuating installation of the component in the computer housing, and further being responsive to the pivoting of said handle in a second direction for effectuating removal of the component from the computer housing; and means for securing the component in the computer housing, said securing means including an interlock member connected to said base and an aperture in said handle, wherein said interlock member is insertable into and interlockable with said aperture.

2. The apparatus as recited in claim 1, and further comprising:

a first pin member connected to said first end of said handle;

said base includes a first end;

a first flange extending from said first end of said base, said first flange having a opening therein;

wherein said first pin member is insertable into said opening of said first flange.

3. The apparatus as recited in claim 2, and further comprising:

a second pin member connected to said second end of said handle;

said base includes a second end; and a second flange extending from said second end of said base, said second flange having a opening therein;

wherein said second pin member is insertable into said opening of said second flange.

4. The apparatus as recited in claim 1, wherein:

said securing means further includes a first tab extending from said first end of said handle, wherein said first tab is insertable into a portion of the computer housing when said interlock member is inserted into said aperture.

5. The apparatus as recited in claim 4, wherein:

said securing means further includes a second tab extending from said second end of said handle, wherein said second tab is insertable into a second portion of the computer housing when said interlock member is inserted into said aperture.

6. The apparatus as recited in claim 1, wherein:

said means for installing and removing includes a first tab extending from said first end of said handle, said first tab for engaging a portion of the computer housing when said handle is pivoted in the first direction to effectuate the installation of the component in the computer housing.

7. The apparatus as recited in claim 6, wherein:

said means for installing and removing includes a second tab extending from said second end of said handle, said second tab for engaging a second portion of the computer housing when said handle is pivoted in the first direction to effectuate the installation of the component in the computer housing.

8. The apparatus as recited in claim 1, wherein:

said means for installing and removing includes a first notch at said first end of said handle, said first notch for engaging a portion of the computer housing when said handle is pivoted in the second direction to effectuate the removal of the component from the computer housing.

9. The apparatus as recited in claim 8, wherein:

said means for installing and removing includes a second notch at said second end of said handle, said second notch for engaging a second portion of the computer housing when said handle is pivoted in the second direction to effectuate the removal of the component from the computer housing.

10. A computer system having a removable component, comprising;

a computer housing adapted for receiving the component;

a base connectable to the component;

a generally C-shaped handle including a first end and a second end, with each of said first end and said second end of said handle pivotally connected to said base;

an installation/removal device responsive to pivoting said handle in a first direction for effectuating installation of the component in said computer housing, and said installation/removal device responsive to pivoting said handle in a second direction for effectuating removal of the component from said computer housing; and means for securing the component in said computer housing, said securing means including an interlock member connected to said base and an aperture in said handle, wherein said interlock member is insertable into and interlockable with said aperture.

11. The computer system as recited in claim 10, and further comprising:

a first pin member connected to said first end of said handle;

said base includes a first end;

a first connection member extending from said first end of said base, said first connection member having a opening therein;

wherein said first pin member is insertable into said opening of said first connection member.

12. The computer system as recited in claim 11, wherein:

said securing means includes a first tab extending from said first end of said handle, wherein said first tab is inserted into a portion of said computer housing when said interlock member is inserted into said aperture.

13. The computer system as recited in claim 11, wherein:

said installation/removal device includes a first tab extending from said first end of said handle, wherein said first tab engages a portion of said computer housing when said handle is pivoted in the first direction for effectuating installation of the component in said computer housing.

14. The computer system as recited in claim 13, wherein:

said installation/removal device includes a second tab extending from said second end of said handle, wherein said second tab engages a second portion of said computer housing when said handle is pivoted in the first direction for effectuating installation of the component in said computer housing.

15. An apparatus for installing, securing and removing a component from a computer chassis, said apparatus comprising:

a generally C-shaped base connectable to the component;

a generally C-shaped handle including a first end and a second end, with each of said first end and said second end of said handle pivotally connected to said base;

an installation/removal device responsive to pivoting said handle in a first direction for effectuating installation of the component in the computer chassis, and said installation/removal device response to pivoting said handle in a second direction for effectuating removal of the component from the chassis; and a securing device for securing the component in the chassis, said securing device including an interlock member connected to said base and further including an aperture extending through said handle, wherein said interlock member is insertable into and interlockable within said aperture.

16. The apparatus as recited in claim 15, and further comprising:

a first pin member connected to said first end of said handle;

said base includes a first end; and a first connection member extending from said first end of said base, said first connection member having a opening therein;

wherein said first pin member is insertable into said opening of said first connection member.

17. The apparatus as recited in claim 15, wherein:

said installation/removal device includes a first tab extending from said first end of said handle, wherein said first tab engages a portion of the computer chassis when said handle is pivoted in the first direction for effectuating installation of the component in the computer chassis.

* * * * *

UNITED STATES PATENT AND TRADEMARK OFFICE
CERTIFICATE OF CORRECTION

PATENT NO. : 5,791,753
DATED : August 11, 1998
INVENTOR(S) : David M. Paquin

It is certified that error appears in the above-identified patent and that said Letters Patent is hereby corrected as shown below:

On the title page: Item [56]

U. S. PATENT DOCUMENTS

| EXAMINER INITIAL | | PATENT NUMBER | | | | | | ISSUE DATE | PATENTEE | CLASS | SUBCLASS | FILING DATE IF APPROPRIATE |
|---|---|---|---|---|---|---|---|---|---|---|---|---|
| | | 4 | 9 | 8 | 2 | 3 | 0 | 3 | 01/01/91 | Krenz | | | |
| | | 5 | 0 | 7 | 7 | 7 | 2 | 2 | 12/31/91 | Geist et al | | | |
| | | 5 | 0 | 1 | 0 | 4 | 2 | 6 | 04/23/91 | Krenz | | | |
| | | | | | | | | | | | | | |

Signed and Sealed this

Second Day of March, 1999

Attest:

Attesting Officer

Q. TODD DICKINSON

Acting Commissioner of Patents and Trademarks